United States Patent
Yeh et al.

(10) Patent No.: US 9,170,381 B2
(45) Date of Patent: Oct. 27, 2015

(54) OPTOELECTRONIC SOCKET CONNECTOR

(75) Inventors: Cheng-Chi Yeh, New Taipei (TW); Andrew Cheng, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 1074 days.

(21) Appl. No.: 13/105,911

(22) Filed: May 12, 2011

(65) Prior Publication Data

US 2011/0280523 A1     Nov. 17, 2011

(30) Foreign Application Priority Data

May 12, 2010    (TW) ................... 99208861 U

(51) Int. Cl.
| | |
|---|---|
| G02B 6/38 | (2006.01) |
| G02B 6/32 | (2006.01) |
| G02B 6/42 | (2006.01) |
| H01R 12/70 | (2011.01) |
| H05K 1/02 | (2006.01) |
| H05K 3/34 | (2006.01) |

(52) U.S. Cl.
CPC .......... *G02B 6/3897* (2013.01); *H01R 12/7076* (2013.01); *H05K 1/0274* (2013.01); *G02B 6/32* (2013.01); *G02B 6/4249* (2013.01); *H05K 3/3436* (2013.01); *H05K 2201/10325* (2013.01)

(58) Field of Classification Search
None
See application file for complete search history.

(56) References Cited

U.S. PATENT DOCUMENTS

| | | | |
|---|---|---|---|
| 4,695,120 A | 9/1987 | Holder | |
| 7,373,033 B2 * | 5/2008 | Lu et al. | ........................... 385/14 |
| 8,374,470 B2 * | 2/2013 | Ban et al. | ........................ 385/49 |
| 2010/0054671 A1 * | 3/2010 | Ban et al. | ........................ 385/88 |

* cited by examiner

*Primary Examiner* — Uyen Chau N Le
*Assistant Examiner* — John M Bedtelyon
(74) *Attorney, Agent, or Firm* — Wei Te Chung; Ming Chieh Chang

(57) ABSTRACT

An electrical connection system for an optoelectronic socket comprises an optoelectronic socket (1), an OE package (2) assembled to the optoelectronic socket (1), and a circuit board (4). The optoelectronic socket (1) comprises a plurality of passageways (104) embedded with an optical member (12) respectively, and a number of electrical contacts. The OE package (2) comprises a plurality of lenses (20) located at bottom portion thereof and a plurality of electrical pads (22) located at peripheral of the bottom portion. Bottom end of the lens (20) of the OE package (2) are received in the passageway (104) and the electrical pads (22) contact with the electrical contacts (14). The optical member (12) is received in recess on upper face of the circuit board (4) and connects with a waveguide (40) positioned in the recess. The electrical contact is soldered to the circuit board.

13 Claims, 9 Drawing Sheets

OPTOELECTRONIC SOCKET CONNECTOR

BACKGROUND OF THE INVENTION

1. Field of the Invention

The present invention relates to a socket connector, and more particularly, to an optoelectronic socket connector is powered to transmit optical and electrical signals.

2. Description of the Prior Art

A conventional electrical connector for electrically connecting an IC package to a printed circuit board comprises an insulative housing and a plurality of contacts received therein to transmit signal and electrical current. The insulative housing comprises a bottom wall and sidewalls extending upwardly from the bottom wall. The bottom wall comprises a top surface and a bottom surface opposite to the top surface. The contacts are made of metal and each comprises a body portion, a contact portion extending beyond the top surface and a tail extending beyond the bottom surface. The body portion is positioned in the bottom wall to secure the contact in the insulative housing. The contact portion is used to contact with the pad of the IC package and the tail is used to contact with the pad of the printed circuit board. Thus, a reliable electrical connection is established between the IC package and the printed circuit board to transmit signal and electrical current.

The growing trend in the IC package field is toward more functions per chip and miniaturization. Accordingly, trend of electrical connector is toward miniaturization and more number of contacts. However, heat produced by the IC package becomes more and more. At The same time, the pitch between the contacts becomes smaller and smaller, thus the electromagnetic interference becomes more and more severe. Another problem is that the IC package presses the contact portion of the contact so as to establish engagement therebetween, if the contact portions are not located at a same height, some of the contacts will not touch the IC package. The electrical connector will not function normally.

U.S. Pat. No. 4,695,120 issued to Holder on Sep. 22, 1987 discloses an optical-coupled IC and a socket for the optical-coupled IC. As shown in FIG. 3, body 60 of the socket provides mechanical support and restraint for the IC 61 and provides means for mounting the assembly to a base plate or chassis 62. As shown, bosses 63 and 64 penetrate the chassis to provide access for the optic fibers 65 and 66. Transmission of the optic signal/data 67/68 to and from the IC 61 and the end of the optic fibers is facilitated by refractive-index matching systems 70 and 71 such as a transparent putty-like material. This material serves to decrease the signal loss and reflections in the optic path. The socket will have some restraining device for the optic fiber such as a friction ridge or spur on its inner diameter, or a clamping system possibly using a thermo-shrink or shape-memory material (not shown). However, structure of assembly of the socket and the optical-coupled IC 61 may be too complicated. Moreover, there is no individual electrical contact in the socket for transmitting electrical powering; thus electrical connection between the optical-coupled IC 61 and the socket may be inadequate and unsteady.

Therefore, it is needed to find a new socket assembly to overcome the problems mentioned above.

SUMMARY OF THE INVENTION

Accordingly, an object of the present invention is to provide an electrical connection for an optoelectronic socket for transmitting optical signal and power.

In order to achieve the object set forth, an electrical connection system for an optoelectronic socket comprises an optoelectronic socket, an Optoelectronic (OE) package assembled to the optoelectronic socket, and a circuit board. The optoelectronic socket comprises a plurality of passageways embedded with an optical member respectively, and a number of electrical contacts. The OE package comprises a plurality of lenses located at bottom portion thereof and a plurality of electrical pads located at peripheral of the bottom portion. Bottom end of the lens is received in the passageway and the electrical pads contact with the electrical contacts. The optical member is received in recess on upper face of the circuit board and connects with a waveguide positioned in the recess. The electrical contact is soldered to the circuit board.

DESCRIPTION OF PREFERRED EMBODIMENT

Reference will now be made to the drawings to describe the present invention in detail.

Figure 1:
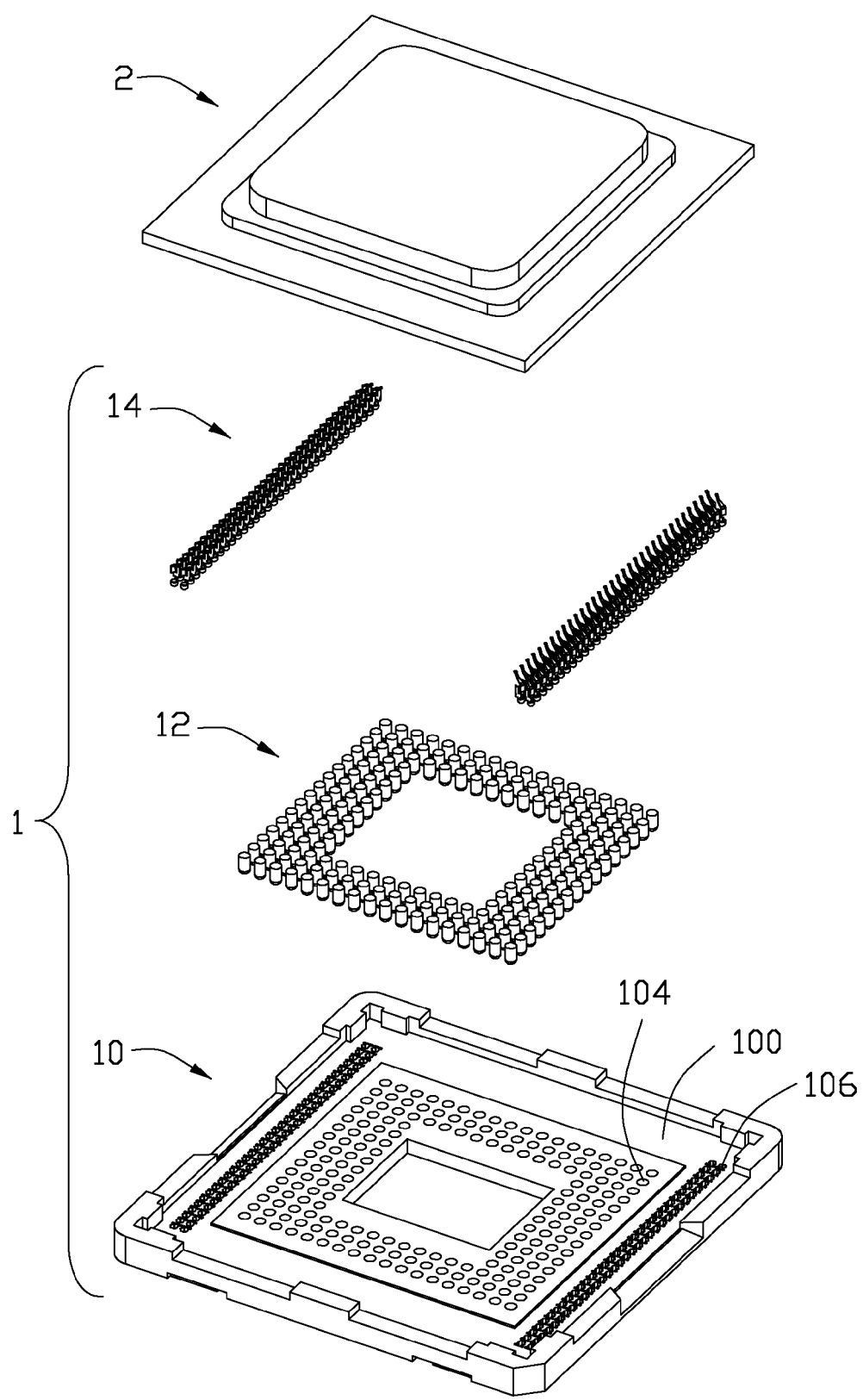
FIG. 1 is an exploded view of an optoelectronic socket and an OE package according to a preferred embodiment of the present invention.
Figure 2:
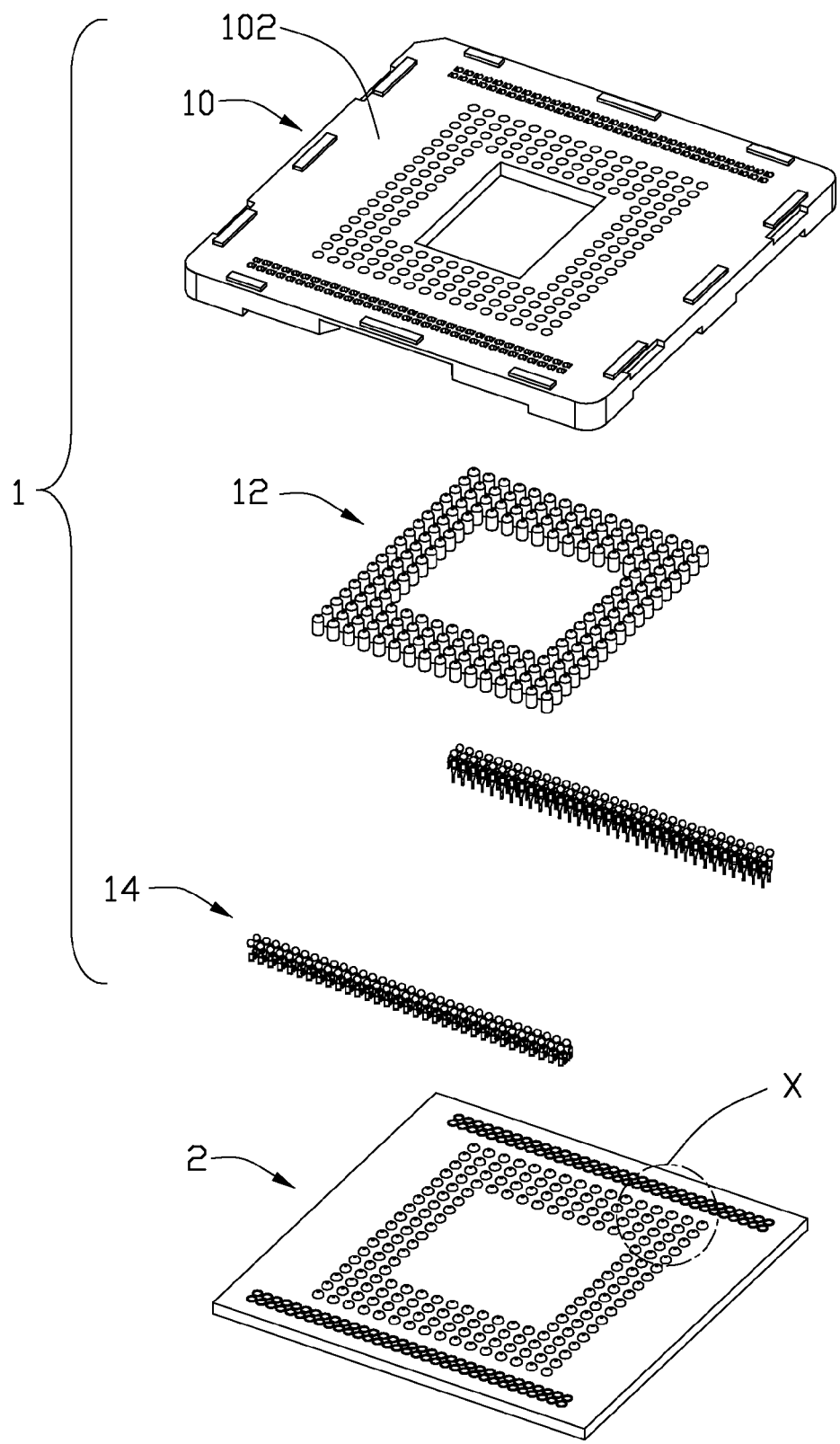
FIG. 2 is also an exploded view of the optoelectronic socket and the OE package shown in FIG. 1.
Figure 3:
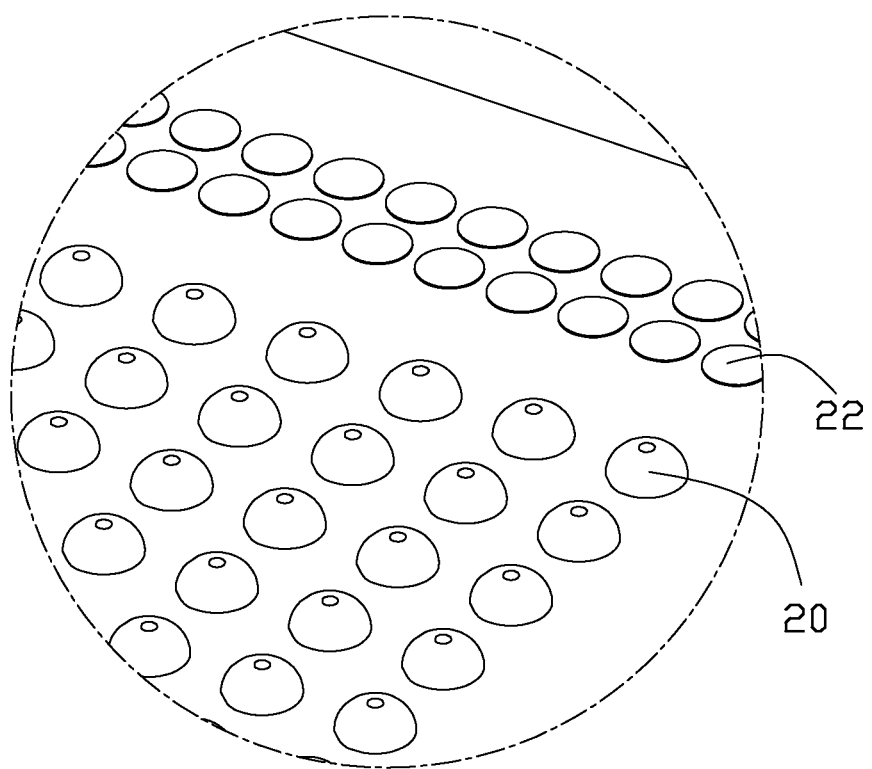
FIG. 3 is an enlarged view of the circled portion labeled as "X" shown in FIG. 2, showing a bottom view of the OE package shown in FIG. 2.
Figure 4:
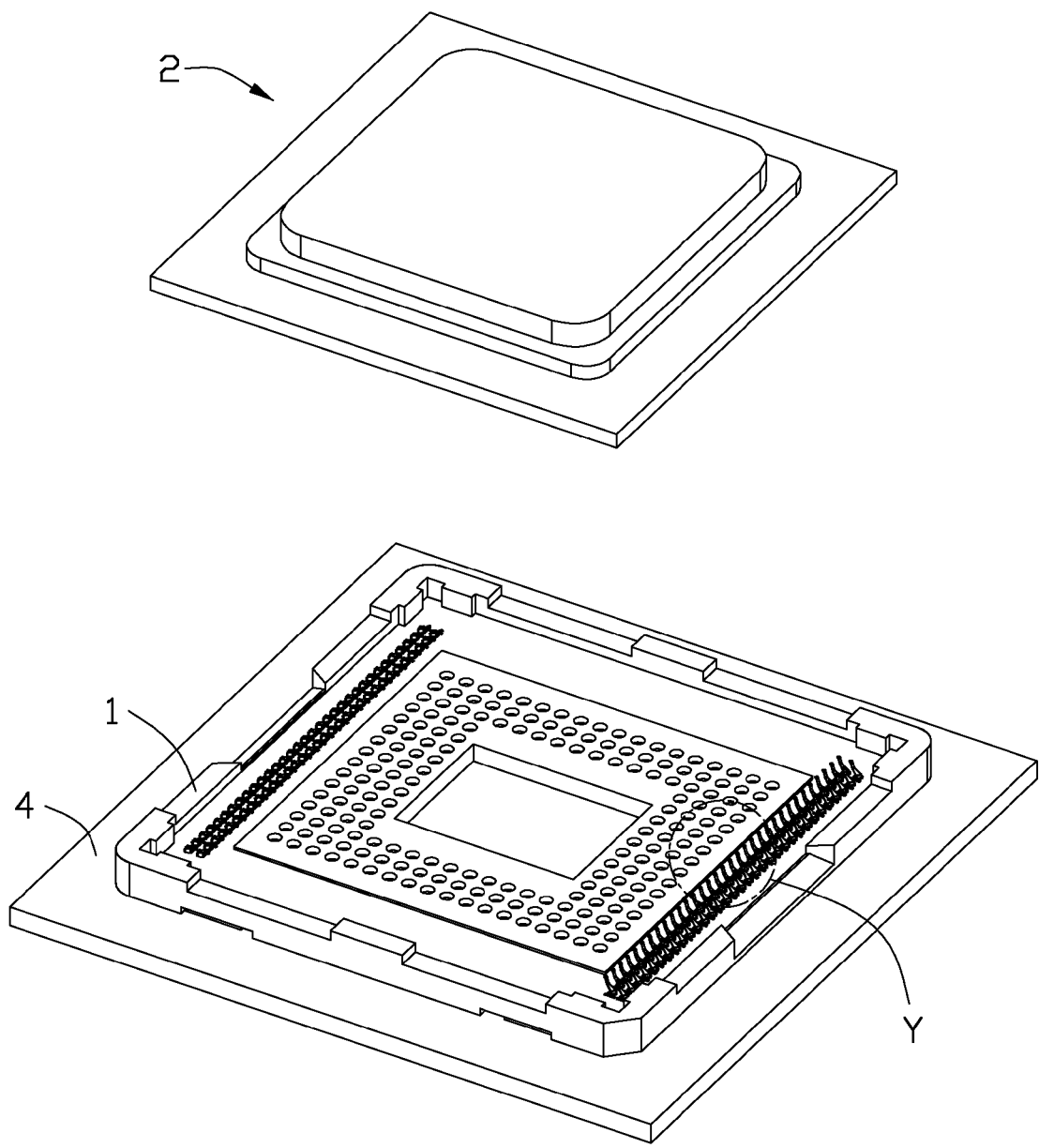
FIG. 4 is an assembled view of the optoelectronic socket mounted on a circuit board, showing an OE package not assembled to the optoelectronic socket.
Figure 5:
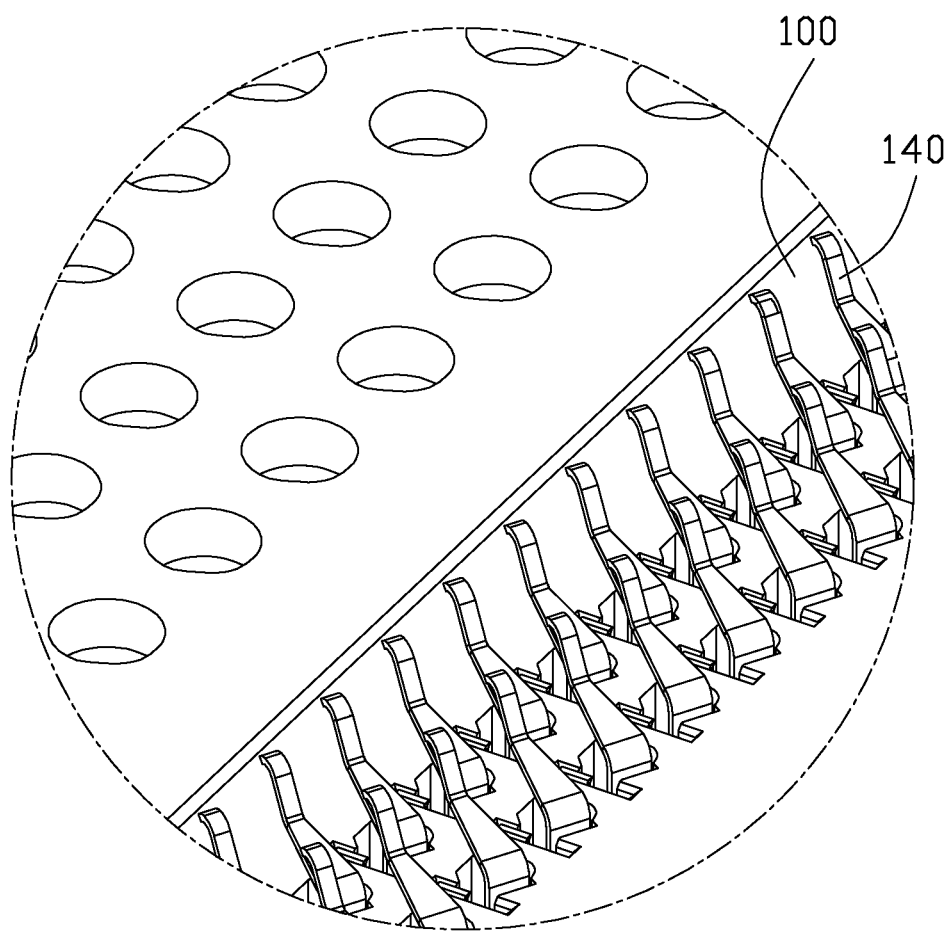
FIG. 5 is an enlarged view of the circled portion labeled as "Y" showing in FIG. 4.
Figure 6:
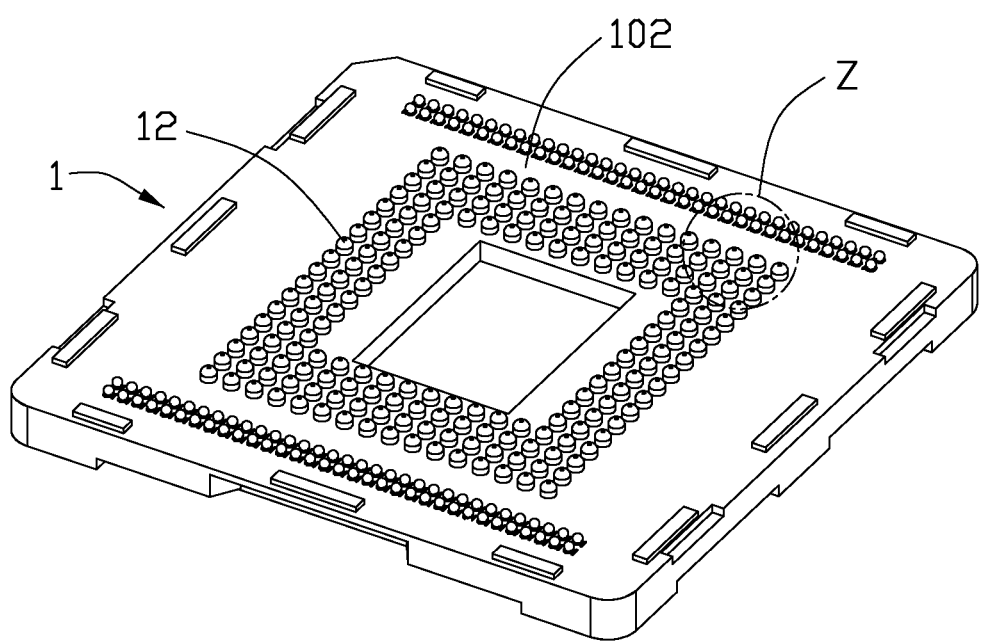
FIG. 6 is a bottom view of the optoelectronic socket.
Figure 7:
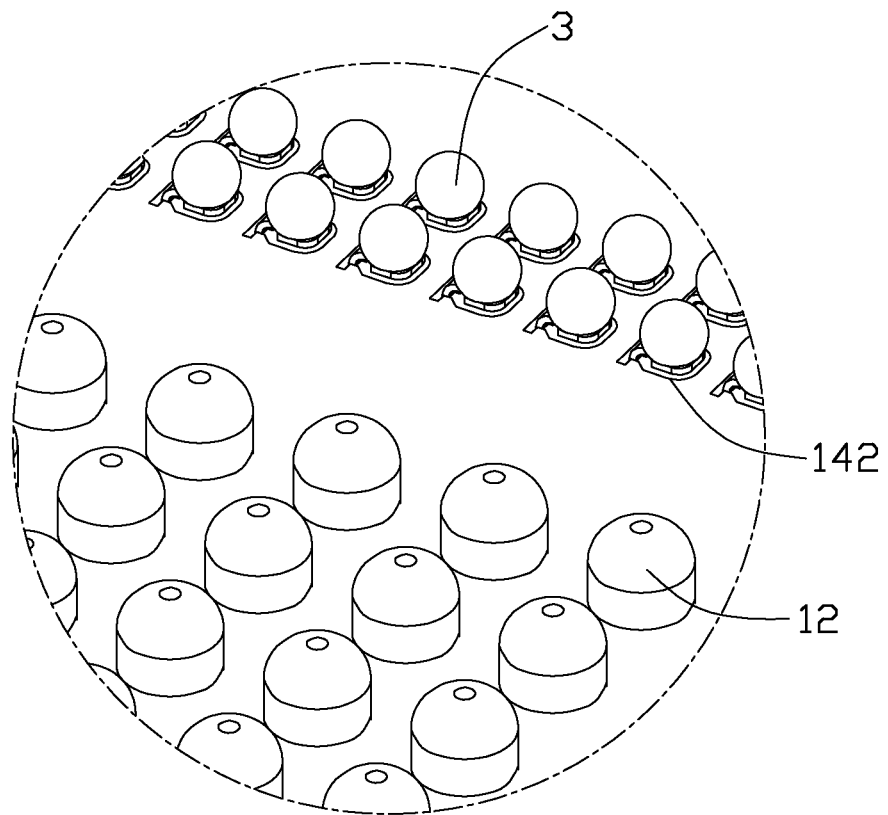
FIG. 7 is an enlarged view of the circled portion labeled as "Z" shown in FIG. 6.
Figure 9:
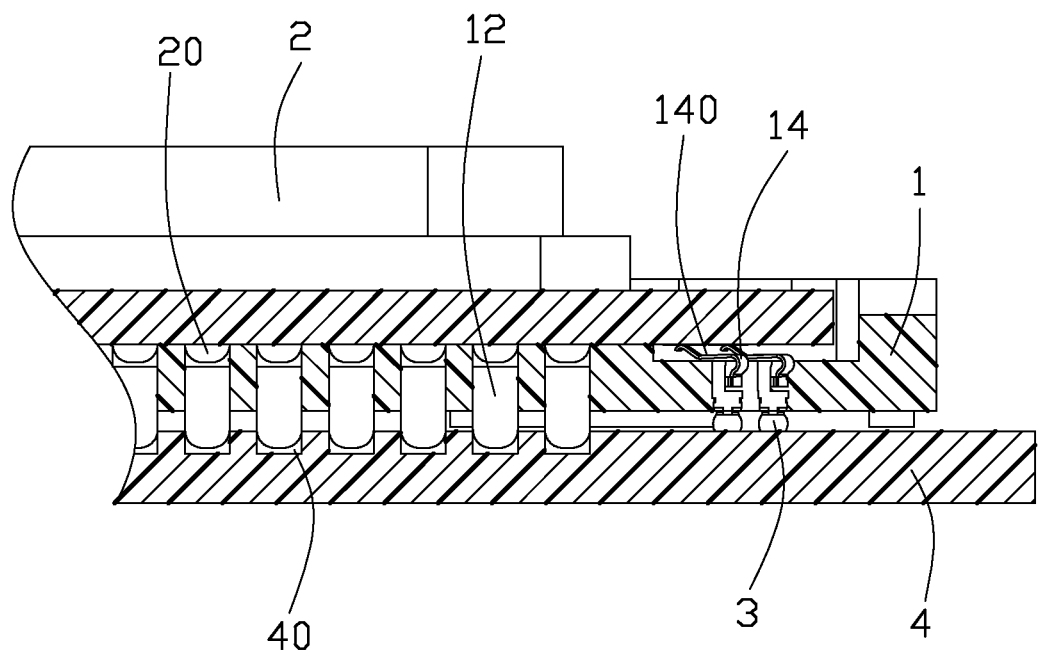
FIG. 9 is a partial cross-sectional view of the assembly taken along line 9-9 in FIG. 8.

Referring to FIG. 1 and FIG. 9, the optoelectronic socket 1 of the present invention is used for electrically connecting an optoelectronic (OE) package 2 to a circuit board 4. The optoelectronic socket 1 comprises an insulative housing 10, a plurality of optical members 12 to transmit optical signal and a plurality of electrical contacts 14 to transmit power. The OE package 2 comprises a plurality of lenses 20 located at bottom portion thereof and a plurality of electrical pads 22 located at peripheral region of the bottom portion of the OE package 2.

The insulative housing 10 comprises a base portion (not labeled), and a plurality of sidewalls (not labeled) extending upwardly. The base portion and the sidewalls jointly define a receiving cavity for receiving the OE package 2. The base portion of the insulativer housing 10 has an upper surface 100, an opposite lower surface 102, and a number of passageways 104 extending between the upper surface 100 and lower surface 102.

The optical member 12 of the optoelectronic socket 1 is a lens. The optical member 12 is positioned in the passageway 104 with bottom end thereof located below the lower surface 102. The electrical contacts 14 are made of metallic material and received in periphery region of the base portion while the optical members 12 occupy central region of the base portion of the insulative housing 10. The electrical contact 14 comprises a spring arm 140 extending upwardly beyond the upper surface 100 of the insulative housing, and a soldering portion 142 extending downwardly so as to be soldered to the circuit board 4. The circuit board 4 defines a number of recesses (not labeled) on upper face thereof. The recesses each has a waveguide 40 positioned therein.

Figure 8:
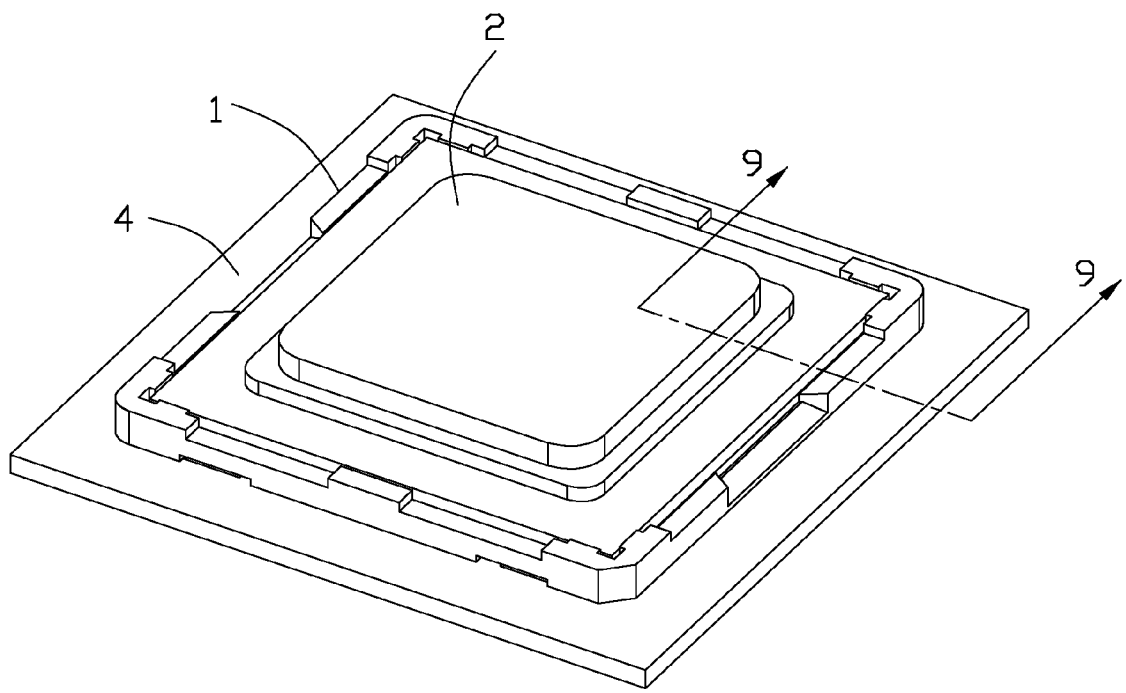
FIG. 8 is an assembled view of the optoelectronic socket mounted on a circuit board, showing an OE package received in the optoelectronic socket.

Referring to FIGS. 8-9, in an assembling process of the OE package 2, the optoelectronic socket 1 and the circuit board 4, the OE package 2 is arranged in the receiving cavity of the insulative housing 10. The lens 20 are received in upper portion of the passageway 104 and the electrical pads 22 contact with the electrical contacts 14 of the optoelectronic socket 1, respectively. Meanwhile, the bottom end of the optical member 12 is received in the recess of the circuit board 4 and connecting with the waveguide 40. The soldering portion 142 of the electrical contact 14 is soldered to the circuit board 4 for transmitting power between the OE package 2 and the circuit board 4. Therefore, an electrical connection system is established.

The electrical connection system uses optical member 12 transmitting signal/data and electrical contacts 14 transmitting power. Thus, heat produced by the system is lower than conventional means and therefore can meet a growing trend of more function and more transmittable members in electrical connection filed.

Although the present invention has been described with reference to particular embodiments, it is not to be construed as being limited thereto. Various alterations and modifications can be made to the embodiments without in any way departing from the scope or spirit of the present invention as defined in the appended claims.

What is claimed is:

1. An electrical connection system, comprising:
an optoelectronic socket comprising an insulative housing with a plurality of passageways, a plurality of optical members received in the passageways and a plurality of electrical contacts attached to the insulative housing;
an Optoelectronic (OE) package comprising a plurality of lenses located at bottom portion thereof and a plurality of electrical pads located at peripheral of the bottom portion, bottom ends of the lenses of the OE package being received in the passageways and located intimately above and aligned with the corresponding optical members, respectively, and the electrical pads contacting with the electrical contacts; and
a circuit board comprising a plurality of recesses corresponding to the passageways of the optoelectronic socket, each of the recesses comprising a waveguide received therein and connecting with the optical member received in the passageway; wherein
the optoelectronic socket is soldered on the circuit board, and the OE package is detachably installed to the optoelectronic socket.

2. The electrical connection system as claimed in claim 1, wherein each of the optical members is a lens.

3. The electrical connection system as claimed in claim 2, wherein the electrical contact comprises a spring arm extending beyond an upper surface of the optoelectronic socket, and a tail portion extending downwardly.

4. The electrical connection system as claimed in claim 3, wherein the tail portion of the electrical contact is soldered to the circuit board.

5. The electrical connection system as claimed in claim 1, wherein the insulative housing comprises a base portion and a plurality of sidewalls extending upwardly from the base portion, the base portion and the sidewalls jointly define a receiving cavity, the OE package is detachably received in the receiving cavity.

6. The electrical connection system as claimed in claim 5, wherein the electrical contacts are received in periphery region of the base portion while the optical members occupy a central region of the base portion.

7. The electrical connection system as claimed in claim 6, wherein each of the optical members of the optoelectronic socket is partly located in the corresponding recess of the circuit board when the optoelectronic socket is soldered on the circuit board.

8. An optoelectronic socket assembly for connecting to a circuit board, comprising:
an optoelectronic (OE) package having a plurality of lenses;
an insulative housing;
a plurality of optical members received and positioned in a central region of the insulative housing for facing said lenses of the OE package; and
a plurality of electrical contacts located on a periphery region of the insulative housing and comprising an upper spring arm and a lower contacting portion;
wherein the upper spring arms of the electrical contacts are detachably connected with electrical pads of the OE package;
wherein the housing forms a plurality of passageways, said plurality of optical members are respectively received in the corresponding passageways, and bottom ends of the lenses of the OE package are received in the corresponding passageways and located intimately above and aligned with the corresponding optical members, respectively.

9. The optoelectronic socket assembly as claimed in claim 8, wherein the spring arm extends upwardly beyond an upper surface of the housing.

10. The optoelectronic socket assembly as claimed in claim 8, wherein the insulative housing comprises a base portion and a plurality of sidewalls extending upwardly from the base portion, and the base portion and the sidewalls jointly define a receiving cavity, and the OE package is detachably received in the receiving cavity.

11. The optoelectronic socket assembly as claimed in claim 10, wherein the electrical contacts are received in periphery region of the base portion while the lenses occupy the central region of the base portion of the insulative housing.

12. The optoelectronic socket assembly as claimed in claim 8, wherein the lower contacting portions of the electrical contacts are soldered to the circuit board.

13. The optoelectronic socket assembly as claimed in claim 8, wherein said housing includes a horizontally extending base portion on which both said central region and said periphery region are located.

* * * * *